United States Patent
Iwamoto et al.

(10) Patent No.: US 9,536,765 B2
(45) Date of Patent: Jan. 3, 2017

(54) LOAD PORT UNIT AND EFEM SYSTEM

(71) Applicant: TDK Corporation, Tokyo (JP)

(72) Inventors: Tadamasa Iwamoto, Tokyo (JP); Jun Emoto, Tokyo (JP); Toshihiko Miyajima, Tokyo (JP); Hidenori Tsutsui, Tokyo (JP)

(73) Assignee: TDK Corporation, Tokyo (JP)

( * ) Notice: Subject to any disclaimer, the term of this patent is extended or adjusted under 35 U.S.C. 154(b) by 144 days.

(21) Appl. No.: 14/291,352

(22) Filed: May 30, 2014

(65) Prior Publication Data

US 2014/0363258 A1 Dec. 11, 2014

(30) Foreign Application Priority Data

Jun. 6, 2013 (JP) .................................. 2013-119576

(51) Int. Cl.
*H01L 21/673* (2006.01)
*H01L 21/677* (2006.01)
*H01L 21/67* (2006.01)

(52) U.S. Cl.
CPC ... *H01L 21/67772* (2013.01); *H01L 21/67017* (2013.01); *H01L 21/67775* (2013.01)

(58) Field of Classification Search
CPC ............. H01L 20/673; H01L 20/67389; H01L 20/67017; H01L 20/67772
USPC ................ 141/51, 63, 70, 98; 206/710–712; 414/217.1, 935
See application file for complete search history.

(56) References Cited

U.S. PATENT DOCUMENTS

| | | | | |
|---|---|---|---|---|
| 6,224,679 B1 * | 5/2001 | Sasaki | ...................... | B08B 5/00 118/719 |
| 6,817,822 B2 * | 11/2004 | Tokunaga | ......... | H01L 21/67772 414/217 |
| 6,867,153 B2 * | 3/2005 | Tokunaga | ......... | H01L 21/67017 141/63 |
| 6,883,539 B2 * | 4/2005 | Inoue | ................ | H01L 21/67772 137/565.23 |
| 6,926,029 B2 * | 8/2005 | Inoue | ................ | H01L 21/67772 137/565.23 |
| 7,523,769 B2 * | 4/2009 | Miyajima | ......... | H01L 21/67017 141/11 |
| 7,726,353 B2 | 6/2010 | Okabe | | |
| 7,789,609 B2 | 9/2010 | Okabe et al. | | |
| 7,841,371 B2 * | 11/2010 | Okabe | ............... | H01L 21/67017 141/51 |
| 8,082,955 B2 * | 12/2011 | Okabe | ............... | H01L 21/67017 141/51 |

(Continued)

FOREIGN PATENT DOCUMENTS

| | | |
|---|---|---|
| JP | 2007-180516 | 7/2007 |
| JP | 2009-38073 | 2/2009 |

(Continued)

*Primary Examiner* — Nicolas A Arnett
(74) *Attorney, Agent, or Firm* — Oblon, McClelland, Maier & Neustadt, L.L.P.

(57) ABSTRACT

A load port unit can prevent or control leakage of inert gas from an EFEM system to the outside. The load port unit used in the EFEM system is provided with an air inlet that opens on a side facing a mini-environment between the upper end of an opener driving unit and the lower end of the pod. The width of the air inlet opening is larger than the width of the opening of the pod. With this arrangement, surplus gas is sucked from the pod when gas purging is performed on the pod.

7 Claims, 4 Drawing Sheets

(56) References Cited

U.S. PATENT DOCUMENTS

| | | | | |
|---|---|---|---|---|
| 8,302,637 B2* | 11/2012 | Okabe | ............... | H01L 21/67772 141/63 |
| 8,375,998 B2* | 2/2013 | Okabe | ............... | H01L 21/67017 141/51 |
| 8,413,693 B2* | 4/2013 | Okabe | ............... | H01L 21/67017 141/51 |
| 8,936,050 B2* | 1/2015 | Sugawara | ......... | H01L 21/67772 141/64 |
| 8,978,718 B2* | 3/2015 | Emoto | ............. | H01L 21/67017 141/51 |
| 9,010,384 B2* | 4/2015 | Yoshimura | ........ | H01L 21/67772 141/63 |
| 9,082,807 B2* | 7/2015 | Sugawara | ......... | H01L 21/68735 |
| 9,153,468 B2* | 10/2015 | Emoto | ............. | H01L 21/67772 |
| 2006/0088406 A1* | 4/2006 | Miyajima | ......... | H01L 21/67017 414/805 |
| 2006/0272169 A1* | 12/2006 | Miyajima | ......... | H01L 21/67017 34/211 |
| 2007/0151619 A1* | 7/2007 | Okabe | ............. | H01L 21/67772 141/63 |
| 2007/0151620 A1* | 7/2007 | Okabe | ............... | H01L 21/67017 141/63 |
| 2009/0035099 A1* | 2/2009 | Okabe | ............... | H01L 21/67772 414/217 |
| 2009/0169342 A1* | 7/2009 | Yoshimura | ........ | H01L 21/67775 414/217 |
| 2010/0212775 A1* | 8/2010 | Okabe | ............... | H01L 21/67017 141/63 |
| 2010/0290888 A1* | 11/2010 | Okabe | ............... | H01L 21/67772 414/805 |
| 2012/0060972 A1* | 3/2012 | Okabe | ............... | H01L 21/67017 141/51 |
| 2012/0261031 A1* | 10/2012 | Okabe | ............... | H01L 21/67017 141/63 |
| 2013/0011223 A1* | 1/2013 | Emoto | ............. | H01L 21/67772 414/222.01 |

FOREIGN PATENT DOCUMENTS

| | | |
|---|---|---|
| JP | 4301456 | 7/2009 |
| JP | 4309935 | 8/2009 |

* cited by examiner

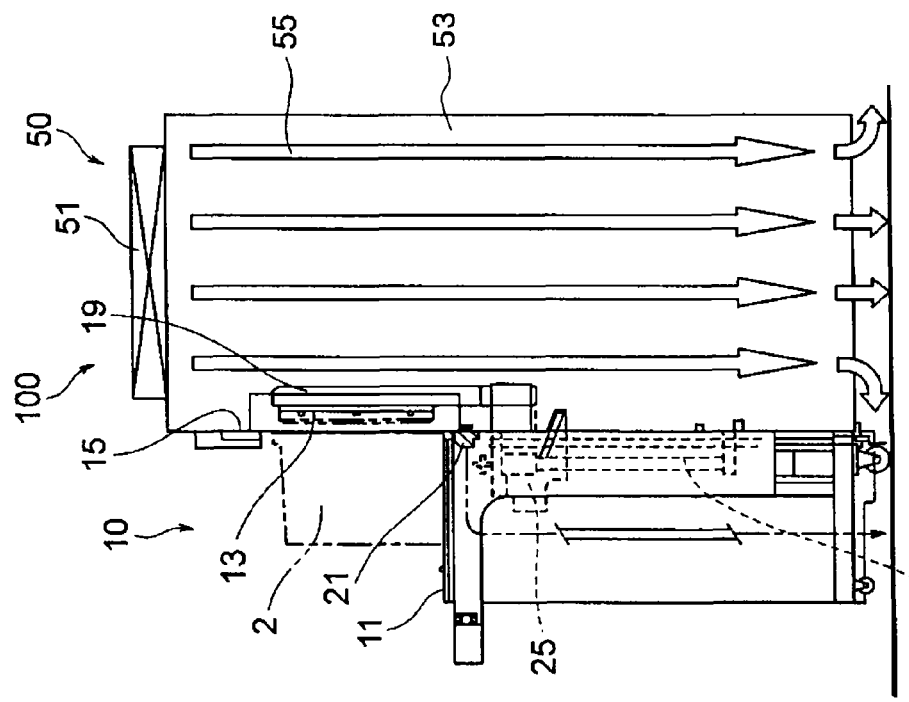
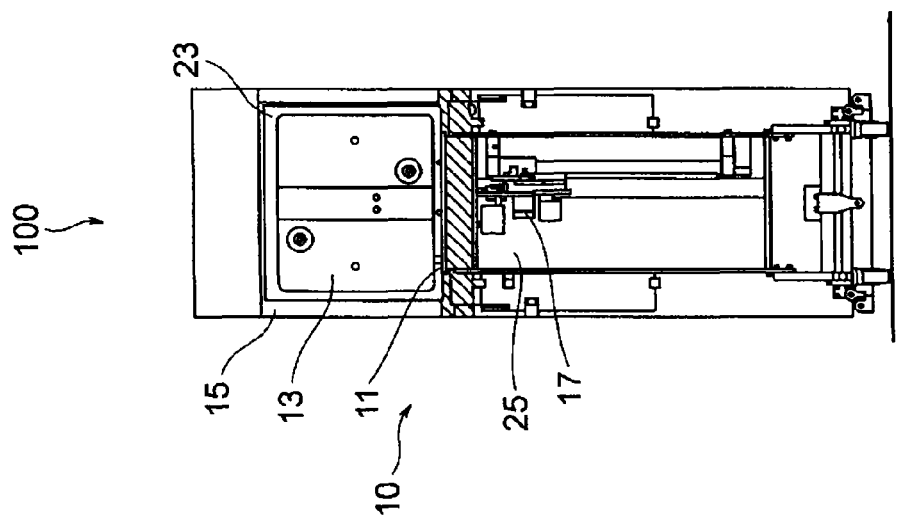
FIG. 1A
FIG. 1B

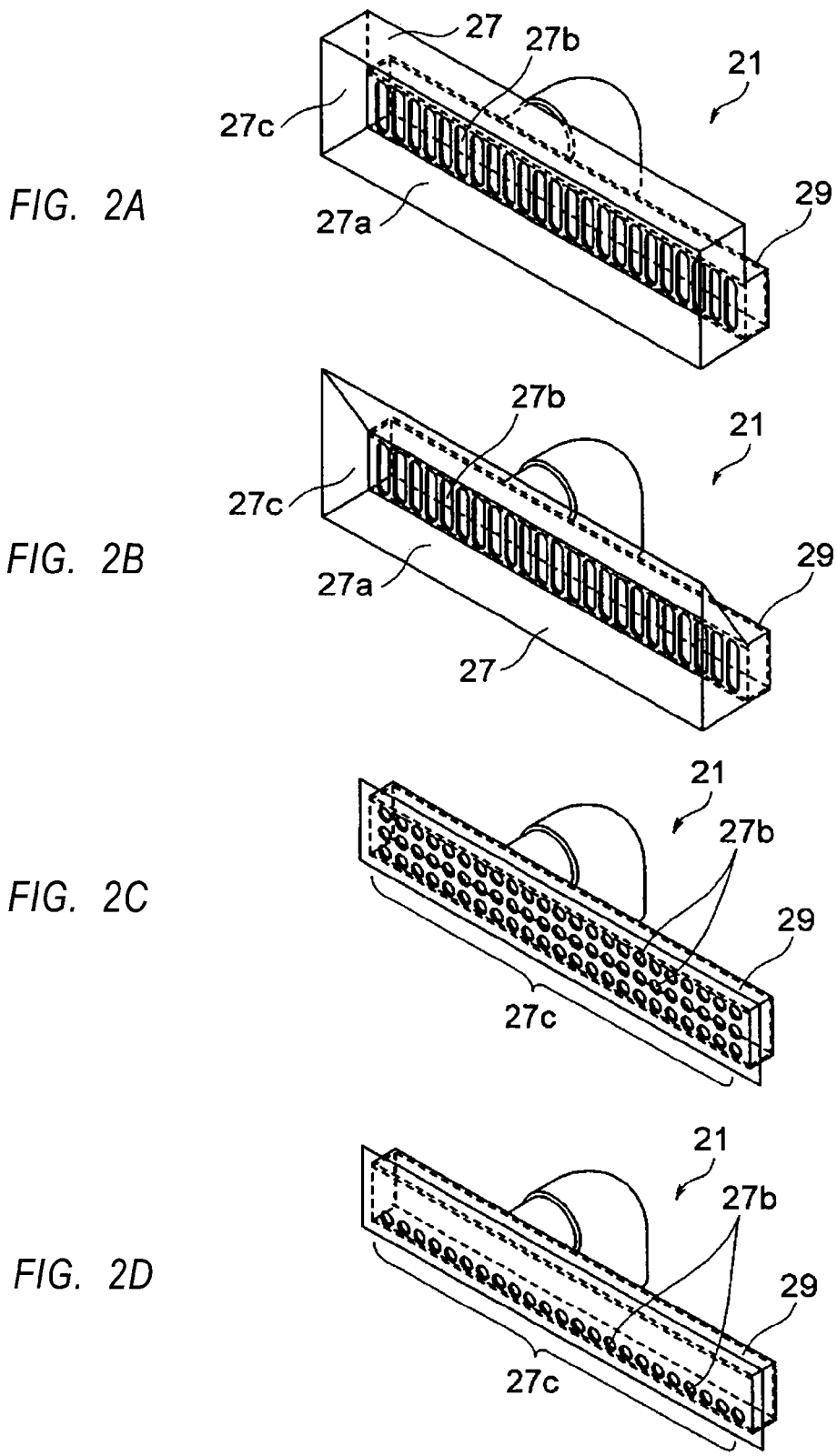

LOAD PORT UNIT AND EFEM SYSTEM

BACKGROUND OF THE INVENTION

Field of the Invention

The present invention relates to what is called an equipment front end module system (which will be hereinafter referred to as an EFEM system), which is used in a semiconductor manufacturing process or the like when transferring wafers stored in an airtight transfer container called a pod to a semiconductor processing apparatus and transferring wafers from the semiconductor processing apparatus to the pod. The present invention also relates to a load port unit used in the EFEM system to open and close the lid of the pod.

Description of the Related Art

In semiconductor manufacturing processes in recent years, there have been widely used a method of keeping a highly clean condition only in the interior of three spaces including the interior of processing apparatuses, the interior of pods in which wafers are stored to enable transfer of the wafers between processing apparatuses, and a mini environment (or small space) through which the wafers are transferred between a pod and each processing apparatus, thereby controlling the cleanliness throughout the process. The pod as such is a container composed of a body in which wafers are stored and that has an opening provided on one side thereof through which wafers are brought into/out of it, and a lid for closing the opening to seal the interior space of the pod. The mini environment has an opening portion that can be opposed to the opening of the pod, and a second opening portion provided on the semiconductor processing apparatus side opposite to the opening portion.

The mini environment is supplied with environmental air which is cleaned using a filter. The aforementioned apparatus used to open and close the lid of the pod, the mini environment, and a wafer transfer system provided in the mini environment are collectively called an EFEM system. In the EFEM system, the cleanness of the mini environment is kept to a predetermined level by the use of clean air supplied through the filter. With miniaturization and improvement in the performance of semiconductor devices in recent years, wiring patterns used in semiconductor devices have become finer, and it is required more strictly to prevent the patterns from being affected by oxidation. For this reason, systems in which the mini environment is constructed as a closed space in which nitrogen atmosphere having a purity higher than a predetermined level is maintained, as disclosed in Japanese Patent No. 4301456 and Japanese patent No. 4309935, have been employed increasingly.

SUMMARY OF THE INVENTION

In cases where the space inside a pod is purged with nitrogen when the lid of the pod is opened by a system disclosed in Japanese Patent No. 4301456 or 4309935, a simple way of and an important factor in reducing the so-called takt time is to increase the supply of nitrogen. However, a gap is provided between the door of the load port unit and wall having the opening portion through which the lid and wafers pass in order to prevent particles from entering the EFEM system. Moreover, the cover of the lid opening/closing mechanism having the door does not have airtightness in many cases. Therefore, if the supply of nitrogen is simply increased, it is probable that nitrogen leaks outside the EFEM system through such a gap or the like. The probability of leakage is considered to increase with an increase in the diameter of wafers. Therefore, solution to this problem is demanded in order to establish good working environment with EFEM systems.

The present invention has been made in view of the above-described circumstances, and an object of the present invention is to provide a load port unit that can prevent or control leakage of inert gas from an EFEM system even when inert gas such as nitrogen is supplied at high flow rate and to provide an EFEM system including such a load port unit.

To achieve the above object, according to the present invention, there is provided a load port unit used to detach a lid from a pod containing a content to allow the content to be taken out from the pod and transferred into a mini environment, comprising a closing plate constituting a wall that partitions the mini environment from an external space, an opening portion provided in the closing plate, a door capable of opening/closing the opening portion, locking/unlocking the lid on the pod, and attaching/detaching the lid to/from the pod, a door driving mechanism that drives the door, an inert gas nozzle that supplies inert gas into the pod, and an air inlet unit that sucks surplus gas from the mini-environment and the pod, wherein an air inlet opening of an air inlet passage that is formed by the air inlet unit and opens to the mini environment and through which the surplus air passes opens over an area extending between the upper end of the door driving mechanism and the lower edge of an opening of the pod and wider than the width of the opening of the pod.

In the above-described load port unit, it is preferred that the air inlet unit be connected to an air inlet system so that it can suck the surplus gas. It is also preferred that the air inlet unit include an enlarged air inlet opening part that forms the air inlet opening and a tank part that is arranged at a position directly facing the enlarged air inlet opening part, communicates with the air inlet opening through an air inlet through which the surplus gas passes, and provides a buffer space in sucking the surplus gas. Alternatively, the air inlet unit may include a tank part that provides a buffer space in sucking the surplus gas and an air inlet provided on a side of the tank part that faces the mini environment to serve as the air inlet opening. There may be provided a plurality of air inlets. Similarly, there may be provided a plurality of tank parts. It is preferred that the air inlet unit have a valve unit that can adjust the amount of gas inlet or the gas sucked rate.

According to the present invention, leakage of inert gas from an EFEM system to the outside can be prevented or controlled even when inert gas such as nitrogen is supplied at high flow rate for purging of a pod containing large-diameter wafers with the inert gas. Thus, it is possible to maintain safe working environment.

Further features of the present invention will become apparent from the following description of exemplary embodiments with reference to the attached drawings.

BRIEF DESCRIPTION OF THE DRAWINGS

FIGS. 1A and 1B show the outer appearance of an EFEM system according to an embodiment of the present invention, where FIG. 1A is a front view of the system, and FIG. 1B is a left side view of the system.

FIGS. 2A, 2B, 2C, and 2D are magnified perspective views showing an air inlet portion of an air inlet unit used in the EFEM system shown in FIGS. 1A and 1B. FIGS. 2A and 2B illustrate exemplary modes of the air inlet unit.

FIGS. 4A and 4B show exemplary modes of an air inlet unit seen from below the support table.

DESCRIPTION OF THE EMBODIMENTS

Figure 3A:
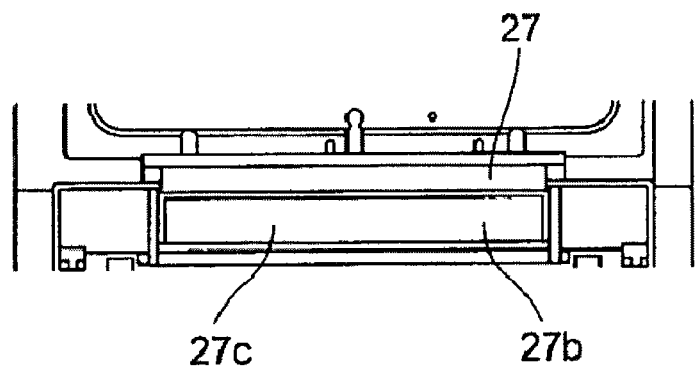
FIGS. 3A, 3B, 3C, and 3D show exemplary modes of an air inlet opening of the air inlet units shown in FIGS. 2A, 2B, 2C, and 2D, seen in the direction from a mini environment to a support table.

Preferred embodiments of the present invention will now be described in detail in accordance with the accompanying drawings.

An embodiment of the present invention will be described with reference to the accompanying drawings. FIGS. 1A and 1B show the outer appearance of an EFEM system 100 according to an embodiment of the present invention. FIG. 1A is a view of the EFEM system 100 and a load port unit 10 as seen from front, and FIG. 1B is a view as seen from left side. The load port unit 10 includes a support table 11, a door 13, a closing plate 15, a door driving mechanism 17, an inert gas nozzle 19, and an air inlet unit 21. The EFEM system 100 includes an EFEM unit 50 that defines the aforementioned mini environment, a fan filter unit (which will be hereinafter referred to as FFU) 51, and the mini environment 53. The load port unit 10 is adapted to detach the lid of a pod 2, in which contents such as wafers are stored, to allow the wafers to be taken out from the pod and transferred into the mini environment 53.

The closing plate 15 has an opening portion 23 as described above and closes the opening side of the mini environment 53 except for the opening portion 23. Thus, the closing plate 15 constitutes a wall that separates the mini environment 53 from the external space. The pod 2 is placed on the support table 11 in such a way that its lid is just opposed to the opening portion 23, when the lid is to be detached/attached from/to the pod 2 and wafers are to be transferred from/into inside the pod 2. In FIG. 1B, a portion of the pod 2 placed on the support table 11 is illustrated in chain double-dashed lines. The door 13 closes the opening portion 23 of the closing plate 15 from the mini environment side. Strictly speaking, it would be appropriate to say that the opening portion 23 is "substantially" closed, because the opening portion 23 is larger than the door 13 and a gap is left around the door 13, when the door 13 is in the closing position.

The door 13 is adapted to hold the lid (not shown) and also functions as an opener that locks/unlocks the lid on the pod body. A door driving mechanism 17 is provided below the support table 11. The door driving mechanism 17 causes the door 13 to open/close the opening portion 23, to lock/unlock the lid on the pod body, and to attach/detach the lid to/from the pod body. The door driving mechanism 17 functions as an opener driving unit. The door driving mechanism 17 is housed in a driving mechanism housing space 25.

In the mini environment 53, an inert gas nozzle 19 is arranged near the opening portion 23. The inert gas nozzle 19 can supply inert gas to the external space through the opening portion 23. The inert gas nozzle 19 is used to supply inert gas into the interior of the pod 2 that is placed on the support table 11 with its lid being detached away by the door 13. While the gas typically used in EFEM systems is nitrogen, other gases categorized as inert gases may also be used. The FFU 51 is arranged in the upper part of the mini environment 53. Particle-controlled clean air is taken into the mini environment through the FFU 51, whereby down flow 55 flowing from the upper part to the lower part is generated.

An air inlet (not shown) is provided in the lower part of the mini environment 53. The down flow 55 helps to discharge particles in the mini environment 53 to the outside through the air inlet. A robot (not shown) for transferring wafers is provided in the mini environment 53, in typical cases. The wafers in the pod are transferred by the robot to a vacuum processing apparatus (not shown) connected to the EFEM system 100.

When inert gas is actually supplied into the pod 2 through the inert gas nozzle 19, the gas containing a large amount of inert gas purged out from the pod 2 is discharged to the external space through the gap between the opening portion 23 and the body of the pod 2. It is considered that a large part of the gas getting out of the pod 2 flows through the lower part of the opening portion 23 and the driving mechanism housing space 25 due to the effect of the down flow 55. In view of this, according to the present invention, an air inlet unit that sucks and discharges the above-described gas is provided between the driving mechanism housing space 25 and the opening of the pod 2. The air inlet unit sucks and discharges surplus gas from the mini environment 53 and the pod 2. In the following, the air inlet unit will be described in detail.

FIGS. 2A to 2D are perspective views showing different modes of the air inlet unit (alone) to be attached to the load port unit 10 shown in FIGS. 1A and 1B. The air inlet unit 21 shown in FIG. 2A has a unit body 27 and a tank part 29. The unit body 27 of the air inlet unit has a box-like shape having one side of which serves as an air inlet opening 27c or an enlarged air inlet opening portion 27a as an open side of the air inlet passage. The side opposite to the open side has a plurality of air inlet holes 27b. The air inlet holes 27b are just opposed to the open side and serves as a part of the aforementioned air inlet passage through which the surplus gas passes. The tank part 29 is in communication with the interior of the box-like part through the air inlet holes 27b and provides a buffer space in which surplus gas to be sucked is stored temporarily. FIG. 2B shows another mode of the air inlet unit 27 in which the shape of the unit body 27 is different from that shown in FIG. 2A. Specifically, the height of the passage gradually decreases from the open side toward the inlet holes 27b to eliminate a portion in which the discharged gas can stagnate.

Although the mode shown in FIG. 2B is preferred in eliminating stagnation of gas, it may sometimes be difficult to design the box part to have an appropriate depth due to constraints of arrangement thereof in relation to other components. In such cases, it is preferred to employ the mode shown in FIG. 2A, in which it is easy to ensure the uniformity of conductance along the direction of arrangement of the air inlet holes 27b. When there are a plurality of air inlet holes 27b, the suction forces acting through the air inlet holes 27b can be non-uniform (vary from one hole to another) depending on the location at which piping for actually sucking gas is connected. Providing the tank part 29 that provides a buffer space downstream of the air inlet holes 27b as with this mode enables the suction forces acting through the plurality of air inlet holes 27 to be made uniform.

It is preferred that the upper edge of the opening of the enlarged air inlet opening portion 27a or the upper edge of the air inlet opening 27c of the air inlet passage be located below the lower edge of the surface of the pod 2 that faces the opening portion 23 in the state in which the pod 2 is directly opposed to the opening portion 23. This positional arrangement enables the gas discharged from the pod 2 to be sucked and discharged immediately. It is more preferred that the upper edge of the air inlet opening 27*c* or the upper edge of the area over which it extends be located the lower edge of the opening portion 23 above in the vertical direction. This positional arrangement enables surplus gas flowing out from the mini environment 53 through the opening portion 23 to be sucked and discharged, so that oxygen existing in front of the opening of the pod 2 can be discharged preferably. It is also preferred that the lower edge of the air inlet opening 27*c* or the lower edge of the area over which it extends be located above the upper end of the components of the door driving mechanism 17 or the upper edge of the mini environment side of the driving mechanism housing space 25. This positional arrangement enables the most part of the gas discharged from the pod 2, which would leak into the driving mechanism housing space in the case of conventional systems, to be sucked and discharged.

It is preferred that both edges of the air inlet opening 27*c* with respect to its longitudinal direction or both edges of the area over which it extends be located outside the ends of the lower edge of the opening of the pod 2 placed to directly face the opening portion 23. Inert gas supplied through the inert gas nozzle 19 is supplied into the interior of the pod 2 and discharged therefrom. Therefore, extending the air inlet opening 27*c* out beyond the edges of the opening of the pod 2 enables the discharged gas to be sucked and discharged effectively. As described above, the air inlet opening 27*c* of the air inlet unit 21, which opens to the mini environment 53 and through which surplus gas passes, extends over an area between the upper end of the door driving mechanism 17 and the lower edge of the opening of the pod 2 and is wider than the width of the opening of the pod 2. The air inlet opening 27*c* opens to the lower part of the opening portion 23 of the closing plate 15 or to an air inlet opening provided below and continuously with the opening portion 23, and the air inlet unit protrudes to the outside opposite to the mini environment 53.

FIG. 2C shows another mode of the air inlet unit 21. The air inlet unit body 27 of this mode does not have the enlarged air inlet opening portion 27*a*, and the air inlet holes 27*b* leading to the tank part 29 directly face the external space. In the above-described modes, the mount surface of the air inlet unit facing the mini environment 53 is the open side of the enlarged air inlet opening portion 27*a*. In this mode, the surface of the tank part 29 on which the air inlet holes 27*b* are provided coincides with the mount surface, and the air inlet holes 27*b* or the group of them constitutes the air inlet opening 27*c*. Below the support table 11 in which the air inlet unit 21 is arranged, there are a space in which the door driving mechanism 17 and an arm (not shown) by which the door driving mechanism 17 supports the door 13 move. From a structural viewpoint, it is preferred that the arm be short, and therefore the dimension of a space in which the air inlet unit 21 is provided is limited with respect to the thickness direction. Eliminating the enlarged inlet opening portion 27*a* as shown in FIG. 2C allows the air inlet unit 21 to be arranged in a smaller space.

FIG. 2D shows another mode of the air inlet unit 21. The air inlet unit 21 of this mode does not have the enlarged air inlet opening portion 27*a*, and one side of the tank part 29 serves as a mount surface, as is the case with the mode shown in FIGS. 2A and 2B. Air inlet holes 27*b* are arranged in the lower portion of this side. In the mode illustrated in FIG. 2C, the air inlet holes 27*b* directly open to the mini environment 53. This enables more reliable prevention of leaking of inert gas to the eternal space. However, there is a possibility that a portion of inert gas to be supplied into the pod may also be discharged. Therefore, it is necessary to adjust the amount of supply of inert gas. In the case of the mode illustrated in FIG. 2A, 2B, or 2D, it is possible to reduce the possibility that inert gas to be supplied into the pod is discharged, and these modes are preferable in terms of reduction of the amount of inert gas supplied. In this case, what is called a buffer region is provided between the lower edge of the opening of the pod defining the opening and a line connecting the upper edge of the air inlet opening 27*c*, namely the buffer region is provided along the vertical direction. While exemplary shapes of the unit body 27, the tank part 29, and the air inlet opening 27*c* of the air inlet unit 21 have been illustrated and described above, it is preferred their shapes be selected or modified in accordance with the amount of inert gas supplied, the volumetric capacity of the pod, and the size of the pod opening and/or other factors.

Now, some modes of the air inlet holes 27*b* will be described with reference to FIGS. 3A to 3D. FIG. 3A shows a mode in which there is no plate provided with the air inlet holes 27*b* shown in FIG. 2A and other drawings, and an opening functioning similarly to the air inlet holes 27*b* directly communicates with the interior of the tank part 29. This mode is simplest in structure and advantageous in that the air inlet or sucked capability of factory equipment, which will be described later, can be used without modifications. However, in this mode, the suction force tends to be non-uniform over the area of the air inlet holes 27*b*. Although the uniformity of the suction force can be improved by providing the tank part 29, it is difficult to make it uniform throughout the area.

Figure 4B:
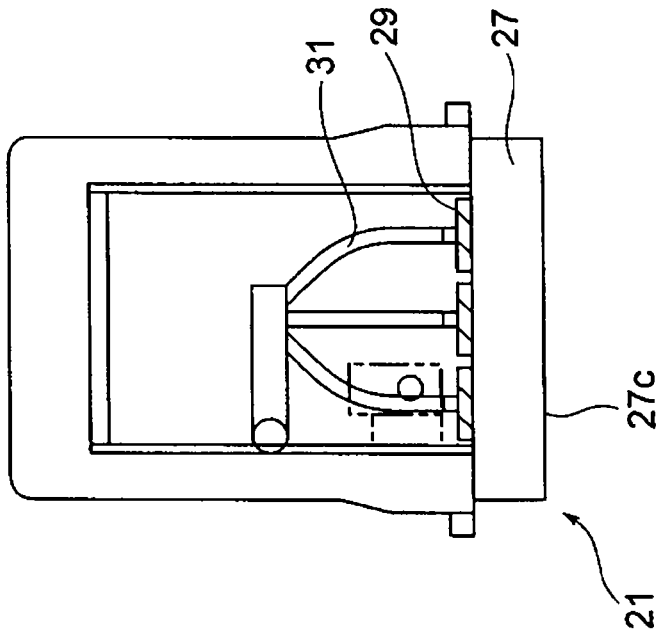
FIGS. 4A and 4B show a structure inside the support table shown in FIGS. 1A and 1B. Specifically.
Figure 4A:
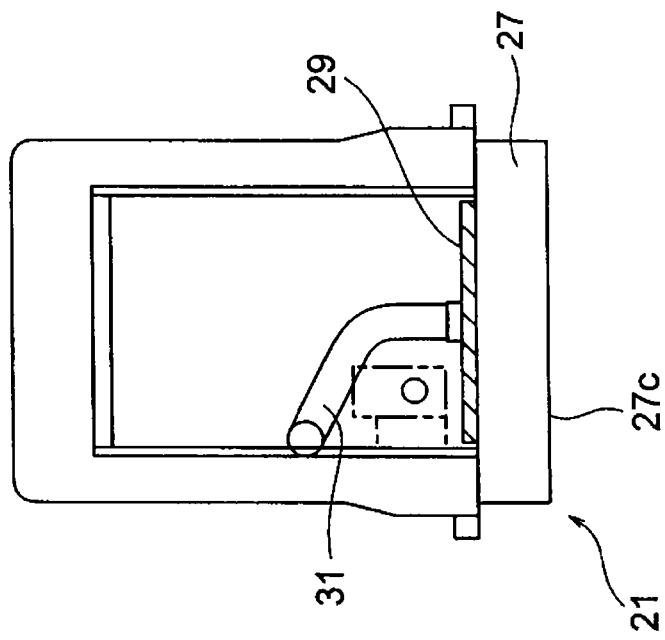

Now, a suction tube 31 provided downstream of the tank part 29 will be described with reference to FIGS. 4A to 4B. FIGS. 4A and 4B schematically show arrangements of the air inlet unit 21 and the suction tube(s) 31 seen from the pod support table side. FIG. 4A shows a mode in which a suction tube 31 is connected to the central portion of the side of the box-like tank part 29 opposite to the side communicating with the air inlet holes 27*b*. It is preferred that the other end of the suction tube 31 away from the tank part 29 be connected to an air inlet system such as an air discharge blower provided as equipment of a factory in which the EFEM system 100 is installed. This enables forcible suction and inlet of surplus gas. In connecting the suction tube 31 to the air inlet blower, it is preferable that a flow rate control valve such as a hand valve, a ball valve, or a butterfly valve be used so that the suction force or the inlet amount can be appropriately adjusted in accordance with the amount of inert gas supplied or alternatively that a shut-off valve be used. This enables appropriate control of the amount of surplus gas inlet or the inlet rate.

Figure 3B:
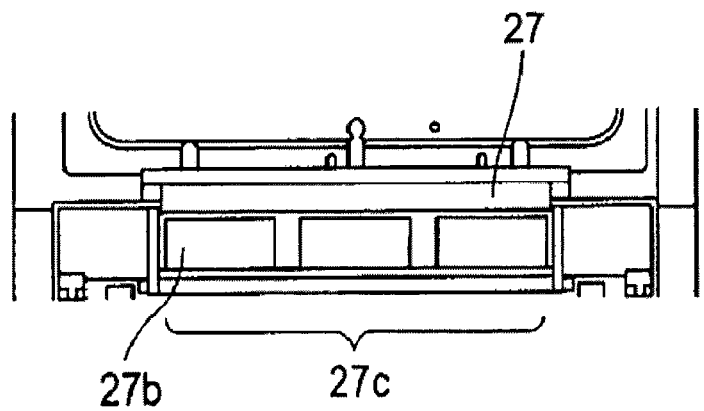

FIG. 3B shows a mode in which the air inlet holes 27*b* shown in FIG. 3A is divided into three sections along the direction in which it extends. In this case, it is preferred that a plurality of downstream tank parts 29 be provided for the respective air inlet holes 27*b* instead of a single downstream tank part 29 and that a suction tube 31 be provided for each of the tank part, as shown in FIG. 4B. In this mode, the suction force can be made uniform over an area larger than that in the case shown in FIG. 3A. While FIG. 3B shows a case in which the air inlet is divided into three, the number of division may be increased taking into consideration the number of suction tubes 31, the arrangement, and the available air inlet capability.

Figure 3C:
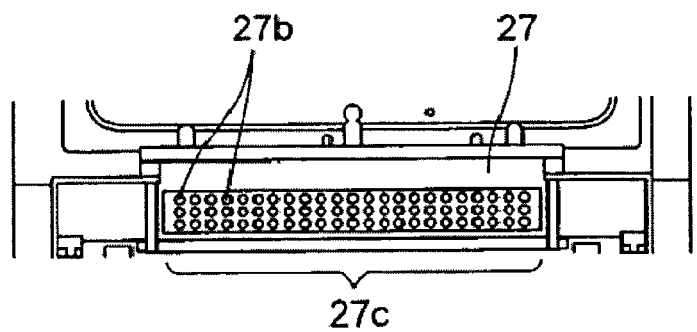

In cases where the number of division is increased, the tank part 29 may be eliminated, and the air inlet holes 27*b* may be directly connected to suction tubes 31. FIG. 3C shows an example of such a mode. In the case shown in FIG. 3C, the air inlet holes 27b is provided in the form of a plurality of small holes on the side of the air inlet unit body 27 having the air inlet holes 27b. Suction tubes 31 are directly connected to the air inlet holes 27b. This mode enables the suction force to act most uniformly over the air inlet opening 27c. In the case of this mode, a tank part 29 may be provided between the suction tubes 31 and the air inlet holes 27b. The tank part 29 provides a buffer space, with which a certain degree of uniformity in the suction force can be achieved all over the area over which the air inlet opening 27c extends. Then, it is possible to achieve a certain degree of uniformity in the suction force over the entire area over which the air inlet opening 27c extends, even in cases where suction tubes 31 having a large diameter are used to ensure sufficient suction force.

Figure 3D:
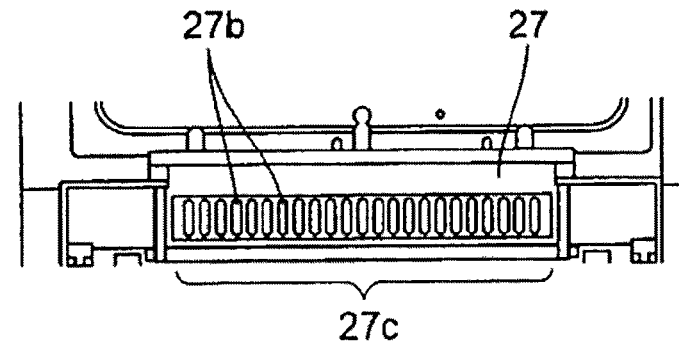

FIG. 3D shows a mode in which the air inlet holes 27b is provided as a plurality of long holes elongated in the direction perpendicular to the length of the air inlet unit body 27. Employing this type of air inlet holes 7b and a plurality of tank parts 29 as shown in FIG. 4B in combination enables both an appropriate suction force and uniformity of the suction force over the entire area over which the air inlet holes 27b are provided. As described above, while these modes are advantageous in regard to the suction force and its uniformity, the mode of the present invention is not limited to them. Air inlet holes 27b having various shapes, arrangements, sizes may be selectively employed, and the number, arrangement, size, and depth of the tank parts 29 may be modified as well.

While FIGS. 3A to 3D, 4A, and 4B show various modes with structures shown in FIGS. 2A and 2B in which the air inlet unit 21 is provided with the air inlet unit body 27. However, the modes shown in FIGS. 3A to 3D, 4A, and 4B may be employed with the structure shown in FIGS. 2C and 2D in which the enlarged air inlet opening portion 27a is eliminated and the side of the tank part 29 having the air inlet holes 27b is used as the mount surface. Alternatively, the tank part 29 may be eliminated, and the air inlet opening 27c including the air inlet holes 27b and the enlarged air inlet opening portion 27a may be directly connected to an air inlet system.

A main object of the present invention is to prevent or control leakage of inert gas from an EFEM system to the external space (outside). The opening portion 23 of the mini environment 53 opens to the external space in which the atmosphere is not cleaned, and external air containing dust can diffuse into the mini environment 53 through the opening portion 53. The air inlet unit 21 provided just below the opening portion 23 according to the present invention can suck such dust around it. Consequently, enhancement of the cleanness can also be expected.

As described above, the present invention relates to a load port unit and an EFEM system having the same used with a semiconductor processing apparatus. However, application of the present invention is not limited to the semiconductor processing apparatus, but the present invention can be applied to a load port unit and an EFEM system having the same used with processing apparatuses for various processing similar to semiconductor processing, such as a processing apparatus for liquid crystal display panels.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-119576, filed Jun. 6, 2013, which is hereby incorporated by reference herein in its entirety.

What is claimed is:

1. A load port unit used to detach a lid from a pod containing a content to allow the content to be taken out from the pod and transferred into a mini environment, comprising:
   a closing plate constituting a wall that partitions the mini environment from an external space;
   an opening portion provided in the closing plate;
   a door capable of opening/closing the opening portion, locking/unlocking the lid on the pod, and attaching/detaching the lid to/from the pod;
   a door driving mechanism that drives the door;
   an inert gas nozzle that supplies inert gas into the pod; and
   an air inlet unit that sucks surplus gas from the mini-environment and the pod,
   wherein an air inlet opening of an air inlet passage that is formed by the air inlet unit and opens to the mini environment and through which the surplus gas passes opens over an area extending between an upper end of the door driving mechanism and a lower edge of an opening of the pod and wider than the width of the opening of the pod, and
   wherein the load port unit is attached to a mini environment where a fan filter unit (FFU) is located to generate a down flow flowing from an upper part of the mini environment to a lower part of the mini environment.

2. The load port unit according to claim 1, wherein the air inlet unit is connected to an air inlet system so that the air inlet unit can suck the surplus gas.

3. The load port unit according to claim 2, wherein the air inlet unit comprises an enlarged air inlet opening part that forms the air inlet opening and a tank part that is arranged at a position directly facing the enlarged air inlet opening part, communicates with the air inlet opening through an air inlet through which the surplus gas passes, and provides a buffer space in discharging the surplus gas.

4. The load port unit according to claim 3, wherein the air inlet comprises a plurality of air inlets.

5. The load port unit according to claim 3, wherein the tank part comprises a plurality of tank parts.

6. The load port unit according to claim 2, wherein the air inlet unit includes a tank part that provides a buffer space in sucking the surplus gas and an air inlet provided on a side of the tank part that faces the mini environment to serve as the air inlet opening.

7. The load port according to claim 2, wherein the air inlet unit has a valve unit that can adjust an amount or a rate of sucking the surplus gas.

* * * * *